(12) United States Patent
Gao et al.

(10) Patent No.: US 11,879,926 B2
(45) Date of Patent: Jan. 23, 2024

(54) METHOD, DEVICE, SYSTEM AND TERMINAL FOR MEASURING TOTAL RADIATION POWER OF ARRAY ANTENNA AND COMPUTER STORAGE MEDIUM

(71) Applicant: ZTE Corporation, Shenzhen (CN)

(72) Inventors: Hua Gao, Shenzhen (CN); Yanchun Zhuang, Shenzhen (CN); Hua Yang, Shenzhen (CN); Hefei Jin, Shenzhen (CN); Junfei Zhao, Shenzhen (CN); Feiyue Zhang, Shenzhen (CN)

(73) Assignee: XI'AN ZHONGXING NEW SOFTWARE CO., LTD., Xi'an (CN)

( * ) Notice: Subject to any disclaimer, the term of this patent is extended or adjusted under 35 U.S.C. 154(b) by 0 days.

(21) Appl. No.: 17/618,748

(22) PCT Filed: Jun. 5, 2020

(86) PCT No.: PCT/CN2020/094753
§ 371 (c)(1),
(2) Date: Dec. 13, 2021

(87) PCT Pub. No.: WO2020/248917
PCT Pub. Date: Dec. 17, 2020

(65) Prior Publication Data
US 2022/0260625 A1 Aug. 18, 2022

(30) Foreign Application Priority Data

Jun. 14, 2019 (CN) .......................... 201910517592.7

(51) Int. Cl.
*G01R 27/04* (2006.01)
*G01R 29/10* (2006.01)

(52) U.S. Cl.
CPC .................................. *G01R 29/105* (2013.01)

(58) Field of Classification Search
CPC .... G01R 29/10; G01R 29/102; G01R 29/105; G01R 29/0814; G01R 29/0821;
(Continued)

(56) References Cited

U.S. PATENT DOCUMENTS 10,587,350 B2 * 3/2020 Rodriguez-Herrera ..................... H04B 17/3912
2013/0249746 A1 9/2013 Oh et al.
(Continued)

FOREIGN PATENT DOCUMENTS

CN 101769967 A 7/2010
CN 102833017 A 12/2012
(Continued)

OTHER PUBLICATIONS

European Patent Office. Extended European Search Report for EP Application No. 20822053.3, dated May 20, 2022, pp. 1-10.
(Continued)

*Primary Examiner* — Thang X Le
(74) *Attorney, Agent, or Firm* — Vivacqua Crane, PLLC

(57) ABSTRACT

Disclosed are a method, apparatus, system and terminal device for measuring the total radiated power of an array antenna, and a non-transitory computer-readable storage medium. The method includes: dividing an array antenna to be measured into N antenna sub-arrays, the N being greater than or equal to 2; determining a sampling interval according to the sizes of the N antenna sub-arrays; determining sampling points according to the sampling interval; and determining the total radiated power of the entire array antenna according to the equivalent isotropic radiated power of the sampling points.

20 Claims, 10 Drawing Sheets

(58) Field of Classification Search
CPC ............ G01R 29/0878; G01R 29/0892; G01R 29/0871; G01R 31/001; G01R 1/0018; H04B 17/102
See application file for complete search history.

(56) References Cited

U.S. PATENT DOCUMENTS

| | | | |
|---|---|---|---|
| 2015/0331022 A1 | 11/2015 | Bai | |
| 2018/0062971 A1* | 3/2018 | Kyosti | H04L 43/50 |
| 2018/0331740 A1* | 11/2018 | Orhan | H04B 17/327 |
| 2019/0187199 A1* | 6/2019 | Mellein | H04B 17/29 |
| 2019/0229817 A1* | 7/2019 | Axmon | H04B 7/0691 |
| 2020/0213016 A1* | 7/2020 | Jing | G01R 29/10 |
| 2020/0389285 A1* | 12/2020 | Nuimura | G01R 29/10 |

FOREIGN PATENT DOCUMENTS

| | | |
|---|---|---|
| CN | 102857310 A | 1/2013 |
| CN | 104079330 A | 10/2014 |
| CN | 104237651 A | 12/2014 |
| CN | 206096274 U | 4/2017 |
| CN | 108540342 A | 9/2018 |
| CN | 109791171 A | 5/2019 |
| WO | 2009039693 A1 | 4/2009 |

OTHER PUBLICATIONS

Mobile World Live. "Advanced mmWave Test Solution Accelerates 5G mmWave Time to Market," published May 30, 2019, pp. 1-4.
International Searching Authority, International Search Report and Written Opinion for PCT Application No. PCT/CN2020/094753 and English translation, dated Aug. 28, 2020, pp. 1-12.
3GPP Technical Specification Group Radio Access Network. "Radio Frequency (RF) requirement background for Active Antenna System (AAS) Base Station (BS) radiated requirements (Release 15)," 3GPP TSG-RAN WG4, Sep. 2018, pp. 1-22.
Japan Patent Office. Notice of Reasons for Refusal for JP Application No. 2021-571654 and English translation, dated Jan. 10, 2023, pp. 1-6.
The State Intellectual Property Office of People's Republic of China. First Search Report for CN Application No. 2019105175927 and English translation, dated Jan. 17, 2023, pp. 1-4.
The State Intellectual Property Office of People's Republic of China. Second Office Action for CN Application No. 2019105175927 and English translation, dated Jan. 28, 2023, pp. 1-18.
The State Intellectual Property Office of People's Republic of China. First Office Action for CN Application No. 201910517592.7, dated Jul. 1, 2022, pp. 1-6.
The State Intellectual Property Office of People's Republic of China. First Search Report for CN Application No. 2019105175927, dated Jun. 27, 2022, pp. 1-2.

\* cited by examiner

811

812

1

METHOD, DEVICE, SYSTEM AND TERMINAL FOR MEASURING TOTAL RADIATION POWER OF ARRAY ANTENNA AND COMPUTER STORAGE MEDIUM

CROSS-REFERENCE TO RELATED APPLICATION

This application is a national stage filing under 35 U.S.C. § 371 of international application number PCT/CN2020/094753, filed Jun. 5, 2020, which claims priority to Chinese patent application No. 201910517592.7, filed Jun. 14, 2019. The contents of these applications are incorporated herein by reference in their entirety.

TECHNICAL FIELD

The embodiments of the present disclosure relate to, but not limited to, the technical field of wireless communication, particularly to, but not limited to, a method, apparatus, system and terminal device for measuring the total radiated power of an array antenna, and a non-transitory computer-readable storage medium.

BACKGROUND

With the increasing demand for higher quality, higher definition and faster response speed, the $5^{th}$-generation (5G) mobile communication technology emerge as the times require, which includes multiple new technologies such as massive array antenna (massive-MIMO), beam forming and millimeter wave communication. The millimeter wave communication technology mainly refers to a communication technology that uses electromagnetic waves (having a frequency of 30 GHz to 300 GHz) of a millimeter-scale wavelength as an access network carrier of a base station. The intervention of the millimeter wave technology reduces the size of the vibrator to a millimeter scale, and the massive array antenna technology is widely applied in 5G communication products. The number of vibrators in the array antenna ranges from 128 to 256 or even 512, which has been applied successfully. The design of the millimeter wave circuit and the application of the massive phase control array antenna require that the antenna and the radio remote unit (RRU) are integrated to form an active antenna system (AAS).

Conventional low-frequency TRP test specification (CTIA specification) is no longer suitable for millimeter wave array antennas due to large measurement errors. In accordance with the 3rd generation partnership project (3GPP), there are two types of devices for the active antenna system (AAS) base station, i.e., 1-O type and 2-O type, which are different in operating frequency but almost the same in the overall architecture, referring to FIG. 1. As shown in FIG. 1, the antenna of this device is fixedly connected to the radio frequency interface in order to make the base station more compact and reduce the transmission loss. In principle, the antenna cannot be detached from the radio frequency interface. Therefore, the conductive tests used in the original standard are not applicable due to the disappearance of the radio frequency interface. In accordance with the 3GPP, the radio frequency tests for 1-O and 2-O devices must adopt radiation tests, i.e., over the air (OTA) tests. In accordance with the TS38.104 standard in 3GPP, the ASS base station belongs to 2-O type 5G devices, and its radio frequency index must be measured in a dark chamber over the air (OTA). The total radiated power (TRP) of the base station is a key OTA test item which is the basis of measuring various radio frequency indexes such as output power, stray and adjacent channel leakage ratio (ACLR) of the base station.

The latest TS38.141-2 standard in 3GPP has proposed sampling algorithms based on the Rayleigh resolution (1.2.2 Reference angular step criteria) and sampling algorithms based on the normalized wave vector space (1.6 Wave vector space grid), which can decrease the number of sampling points and greatly improve the measurement efficiency. However, when the number of array elements is multiplied, the number of points required by Rayleigh resolution sampling schemes will also be multiplied as the beam width is further decreased. Therefore, for an ultra-large array antenna, it is necessary to provide a more efficient test scheme to improve the testing efficiency.

SUMMARY

The embodiments of the present disclosure provide a method, terminal device, system and apparatus for measuring the total radiated power of an array antenna, and a computer storage medium, in order to at least solve one of the technical problems in the related art to a certain extent, including improving the efficiency of testing the total radiated power of an ultra-large array antenna.

In view of this, an embodiment of the present disclosure provides a method for measuring the total radiated power of an array antenna, including: dividing an array antenna to be measured into N antenna sub-arrays, the N being greater than or equal to 2; determining a sampling interval according to the sizes of the N antenna sub-arrays; determining sampling points according to the sampling interval; and, determining the total radiated power of the entire array antenna according to the radiated power of the sampling points.

An embodiment of the present disclosure further provides an apparatus for measuring the total radiated power of an array antenna, including: a partition determination module configured to determine antenna sub-arrays of an array antenna to be measured and determine the sizes of the antenna sub-arrays; a sampling interval determination module configure to determine a sampling interval according to the sizes of the antenna sub-arrays; a sampling point determination module configured to determine sampling points according to the sampling interval by uniformly sampling in an angular space or a wave vector space; and, a total radiated power determination module configured to determine the total radiated power of the entire array antenna according to the radiated power of the sampling points.

An embodiment of the present disclosure further provides a system for measuring the total radiated power of an array antenna, including: an equipment under test (EUT) fixed on a turntable, a testing antenna system, a power detector and a tester, where the EUT includes an array antenna and a radio remote unit which are integrated together, the power detector is connected to the testing antenna system, and the tester is connected to the EUT, the turntable, the testing antenna system and the power detector, respectively, to implement the steps in the method for measuring the total radiated power of an array antenna described above.

An embodiment of the present disclosure further provides a terminal device for measuring the total radiated power of an array antenna, including: a processor, a memory and a communication bus, where the communication bus is configured to realize the communication between the processor and the memory; the memory has computer programs stored thereon; and, the processor is configured to execute one or more computer programs stored in the memory to implement the steps in the method for measuring the total radiated power of an array antenna described above.

An embodiment of the present disclosure further provides a non-transitory computer-readable storage medium having stored thereon one or more programs which, when executed by one or more processors, cause the one or more processors to implement the steps in the method for measuring the total radiated power of an array antenna described above.

DETAILED DESCRIPTION

In order to make the objectives, technical schemes and advantages of the present disclosure clearer, the embodiments of the present disclosure will be further described in detail below by specific implementations with reference to the accompanying drawings. It should be understood that the specific embodiments to be described herein are merely for explaining the embodiments of the present disclosure, rather than limiting the present disclosure.

Embodiment I

In order to improve the efficiency of testing the total radiated power (TRP) of an array antenna in a 5G active antenna system, an embodiment of the present disclosure provides a method for measuring the total radiated power of an array antenna.

In accordance with the 3GPP, base stations in the active antenna system are classified into two types of devices (i.e., 1-O and 2-O), which are different in operating frequency but almost the same in overall architecture. The 1-O and 2-O devices have been known and will not be repeated here. In accordance with the 3GPP, the radio frequency tests for 1-O and 2-O devices adopt radiation tests, i.e., OTA tests.

Generally, OTA tests require dark environments. At present, the dark environments are mainly classified into three categories, i.e., far-field, compact-field and near-field dark chambers. Due to very limited test items in the near-field dark chambers, the ability of 3GPP to test such dark chambers is still in the preliminary research stage. The far-field and compact-field dark chambers are testing environments recognized by 3GPP at present since they can cover more test items.

Figure 1:
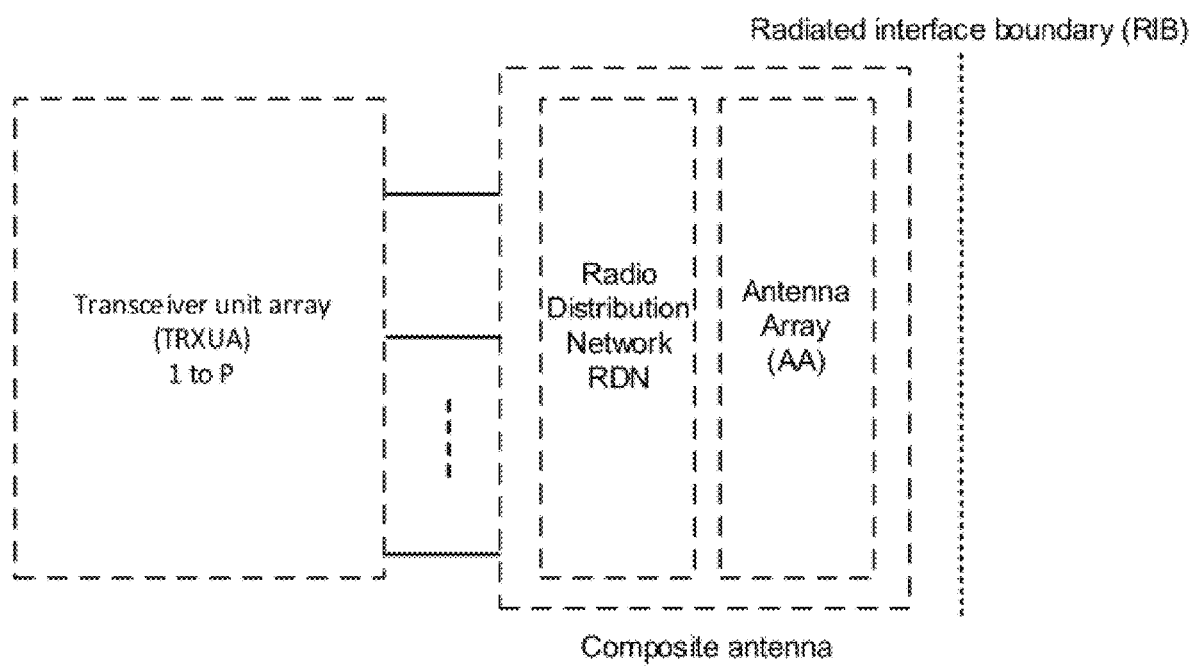
FIG. 1 is a schematic diagram of 1-O and 2-O devices according to various embodiments of the present disclosure.
Figure 2:
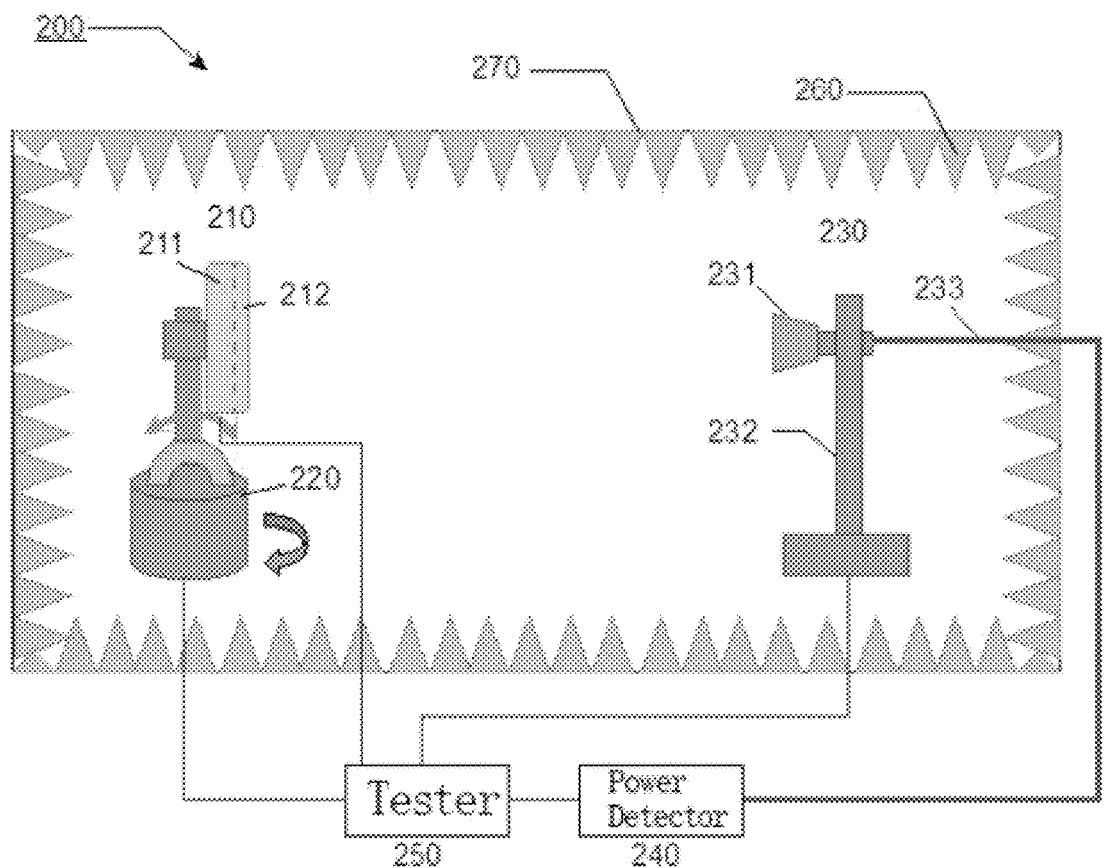
FIG. 2 is a schematic diagram of a testing system according to Embodiment one of the present disclosure.

The OTA testing environment will be described below by taking a far-field dark chamber as an example. Reference may be specifically made to FIG. 2 for the testing system.

The system 200 is configured to measure OTA indexes of an EUT 210. The EUT 210 includes a radio remote unit (RRU) 211 and an array antenna 212. The array antenna 212 is closely integrated with the RRU 211 to form an integrated device, as shown by the dashed line. Opposite to independently measurable RRU and antenna system, transmitting and receiving channels of the EUT 210 are directly connected to the array antenna 212. Since the array antenna 212 and the RRU 211 are integrated together without radio frequency connection, the array antenna cannot be isolated for testing. In other words, it is impossible to calculate complete-machine radio frequency indexes such as equivalent isotropic radiated power (EIRP), total radiated power (TRP), equivalent isotropic sensitivity (EIS) and total isotropic sensitivity (TIS) by simply testing the radiation performance of the array antenna 212 and the transmitting and receiving link performance of the RRU 211. The measurement of the EUT 210 needs to be performed simultaneously.

The EUT 210 is placed and fixed on a turntable 220, and the turntable 220 can rotate in a horizontal plane and a pitching plane. The testing antenna system 230 includes a testing antenna 231, an antenna fixation bracket 232 and a testing cable 233. The testing antenna 231 may be a single antenna, or may be a plurality of antennas. The antenna fixation bracket 232 is configured to fix the testing antenna 231, and can move in a three-dimensional space. The testing antenna 231 is connected to a power detector 240 through the testing cable 233. The power detector 240 may be a vector network analyzer, a spectrometer, a power meter, etc.

The EUT 210, the turntable 220, the antenna fixation bracket 232 and the power detector 240 are all connected to a tester 250. The tester 250 may be configured to control the transmitting/receiving the EUT 210, the rotation of the turntable 220, the movement of the antenna fixation bracket 232 and the transmitting/receiving of the power detector 240, record and process related test data including EIRP values, and record logs.

During the whole test process, the full anechoic chamber environment is isolated from the external environment by a wave absorbing material 260 and a dark chamber wall 270 to simulate an infinite space.

Figure 3:
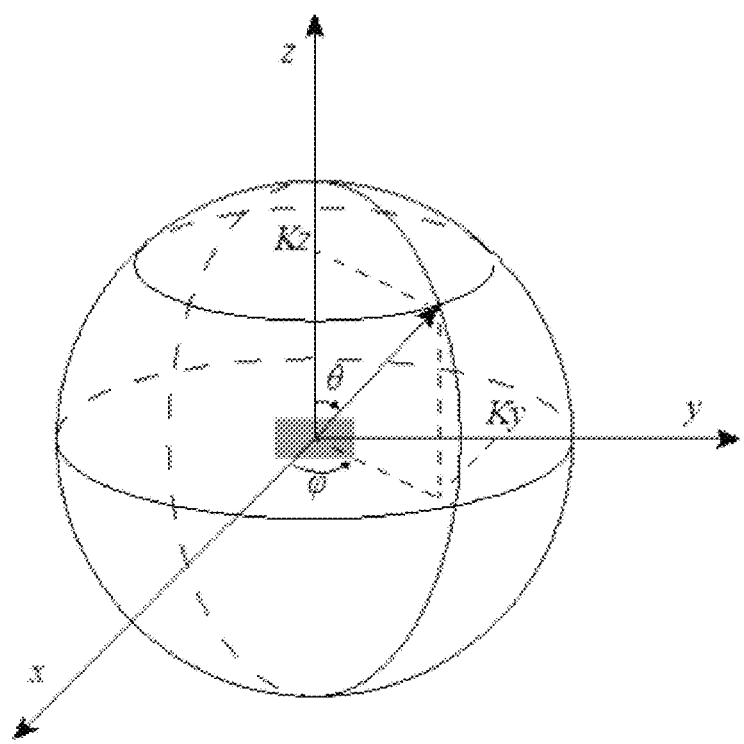
FIG. 3 is a spatial coordinate system of a testing environment according to Embodiment one of the present disclosure.

FIG. 3 is a schematic diagram of a coordinate system using the array antenna 212 on the EUT 210 as a referent point. The x-axis is basically consistent with a normal direction of the antenna array, and the y-axis and the z-axis correspond to a horizontal direction and a vertical direction, respectively. Here, the direction is described by two spatial coordinates. One spatial coordinate is an angular space, that is, it is represented by (θ, φ) in a spherical coordinate system. For example, when a wave vector direction is calibrated as (90°, 0°), it means that it points to the x-axis. The other spatial coordinate is a normalized wave vector space, that is, it is represented by (u, v) in a Cartesian coordinate system, where u and v represent the sizes of the normalized wave vector projection on the y-axis and the z-axis, respectively. For example, when the wave vector direction is calibrated as (0, 0), it means that it points to the x-axis. There is a spatial transformation relationship between the angular space (θ, φ) and the normalized wave vector space (u, v), that is:

$$u=\sin\theta \sin\varphi, v=\cos\theta \qquad (1).$$

The OTA test mainly focuses on EIRP, EIS and TRP. Testing the TRP is a difficulty of the OTA test.

The latest TS38.141-2 standard in 3GPP has proposed sampling algorithms based on the Rayleigh resolution (1.2.2 Reference angular step criteria) and sampling algorithms based on the normalized wave vector space (1.6 Wave vector space grid), which can decrease the number of sampling points and greatly improve the measurement efficiency.

Figure 4A:
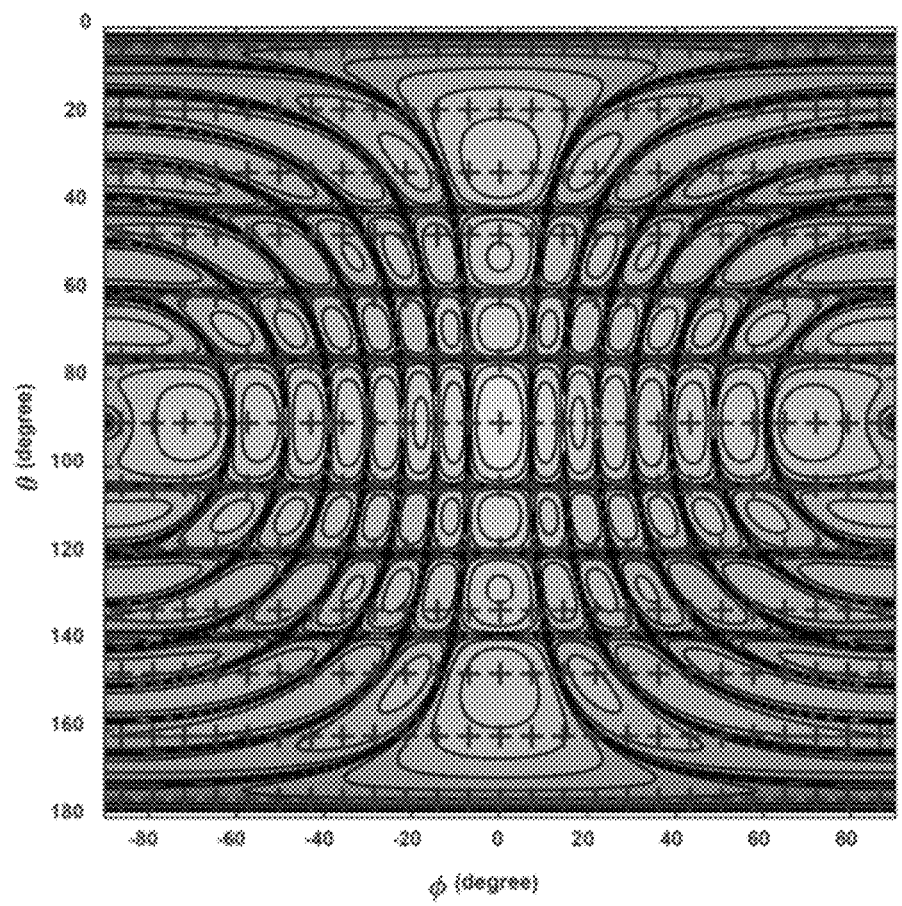
FIG. 4(a) is a schematic diagram of Rayleigh resolution sampling in an angular space according to Embodiment one of the present disclosure.
Figure 4B:
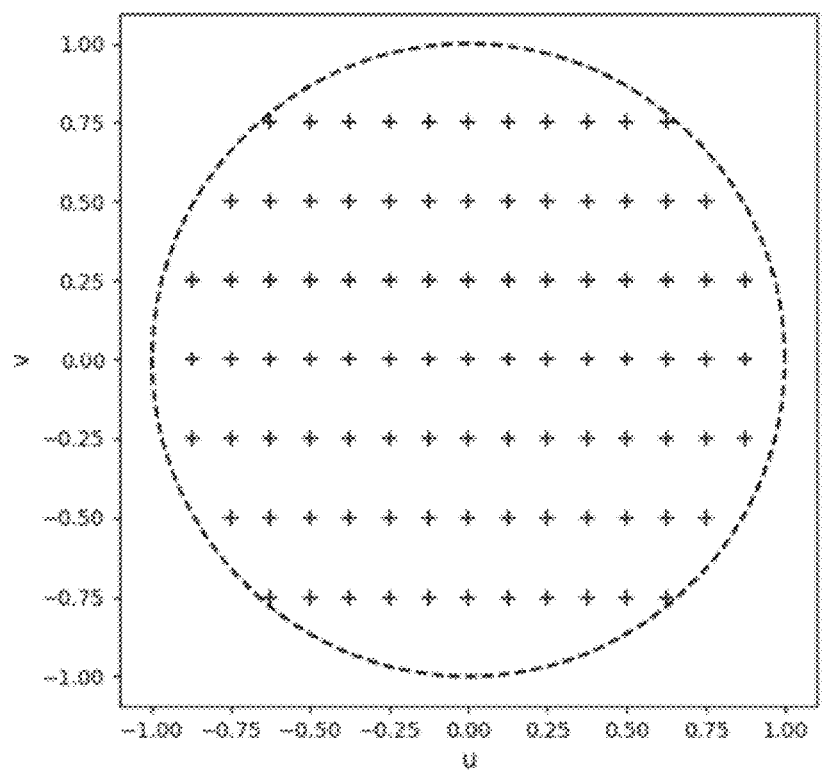
FIG. 4(b) is a schematic diagram of Rayleigh resolution sampling in a wave vector space according to Embodiment one of the present disclosure.
Figure 4C:
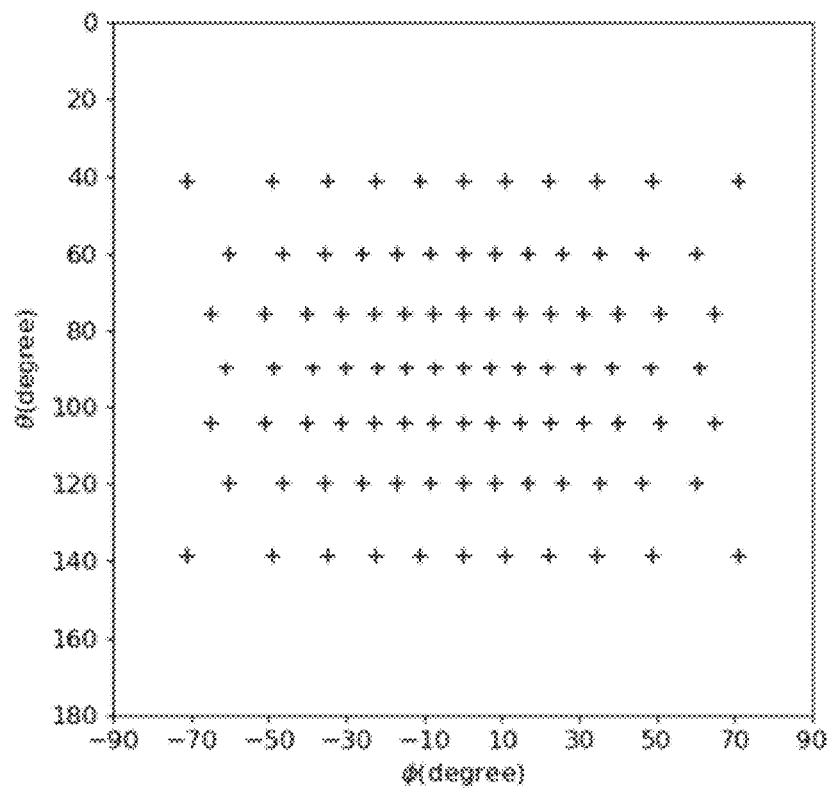
FIG. 4(c) is a schematic diagram of the positions of sampling points of the wave vector space in a spherical coordinate system according to Embodiment one of the present disclosure.

FIG. 4(*a*) shows a schematic diagram of sampling in the angular space using the Rayleigh resolution as an interval. The background picture is a radiation pattern of a 16×8 (y×z) array antenna having a period of half wavelength in the angular space, and the symbol "+" represents sampling points. The Rayleigh resolution (θ$_r$, φ$_r$) can be obtained by the antenna size and the following formula:

$$\theta_r = \frac{180°}{\pi}\sin^{-1}\left(\frac{\lambda}{D_z}\right), \varphi_r = \frac{180°}{\pi}\sin^{-1}\left(\frac{\lambda}{D_y}\right), \qquad (2)$$

where λ is the wavelength, and D$_z$ and D$_y$ are the maximum sizes of the array antenna in the y-direction and the z-direction.

For a common array antenna, i.e., a rectangular array antenna with equal amplitude and same phase, the Rayleigh resolution can also be determined by the First Null Beamwidth (FNBW) of the radiation pattern, that is:

$$\theta_r=FNBW_\theta/2, \varphi_r=FNBW_\varphi/2 \qquad (3).$$

FIG. 4(*b*) shows a schematic diagram of sampling in the normalized wave vector space using the Rayleigh resolution as an interval. The Rayleigh resolution (u$_r$, v$_r$) in the wave vector space can be determined by the size of the array antenna, that is:

$$u_r = \frac{\lambda}{D_y}, v_r = \frac{\lambda}{D_z}, \qquad (4)$$

where D$_y$ and D$_z$ are the maximum sizes of the array antenna in the y-direction and the z-direction.

For a common array antenna, i.e., a rectangular array antenna with equal amplitude and same phase, the Rayleigh resolution can also be determined by the First Null Beamwidth (FNBW) of the radiation pattern, specifically referring to Formula (3).

The antenna corresponding to the sampling points in FIG. 4(*b*) is also a 16×8 (y×z) array antenna having a period of half wavelength, the symbol "+" represents the sampling points, and the sampling points are uniformly distributed in this space. The sampling points are within a circle having a radius of 1, because the fields that can be measured in the far field are all radiation components, while the field evanescent wave components out of the circle are truncated in the far field due to exponential attenuation with distance.

FIG. 4(*c*) shows the positions of the sampling points in the wave vector space shown in FIG. 4(*b*) in the spherical coordinate system. The symbol "+" represents the sampling points. It can be seen from the figure that the sampling points are uniformly distributed in the spherical coordinate system, and the number of points is obviously decreased in comparison to the sampling points in FIG. 4(*a*) (about ⅓ of the points shown in FIG. 4(*a*)). Considering that FIGS. 4(*b*) and (*c*) and FIG. 4(*a*) correspond to the same antenna array, for the number of points shown in FIGS. 4(*b*) and (*c*), there are less sampling points in the wave vector space, and the efficiency is higher. Further, since there is a Fourier transformation relationship between the wave vector space and the space corresponding to the array antenna, sampling in the wave vector space requires the smallest number of points. Therefore, sampling in this space can also be referred to as an optimal sampling scheme.

Figure 5:
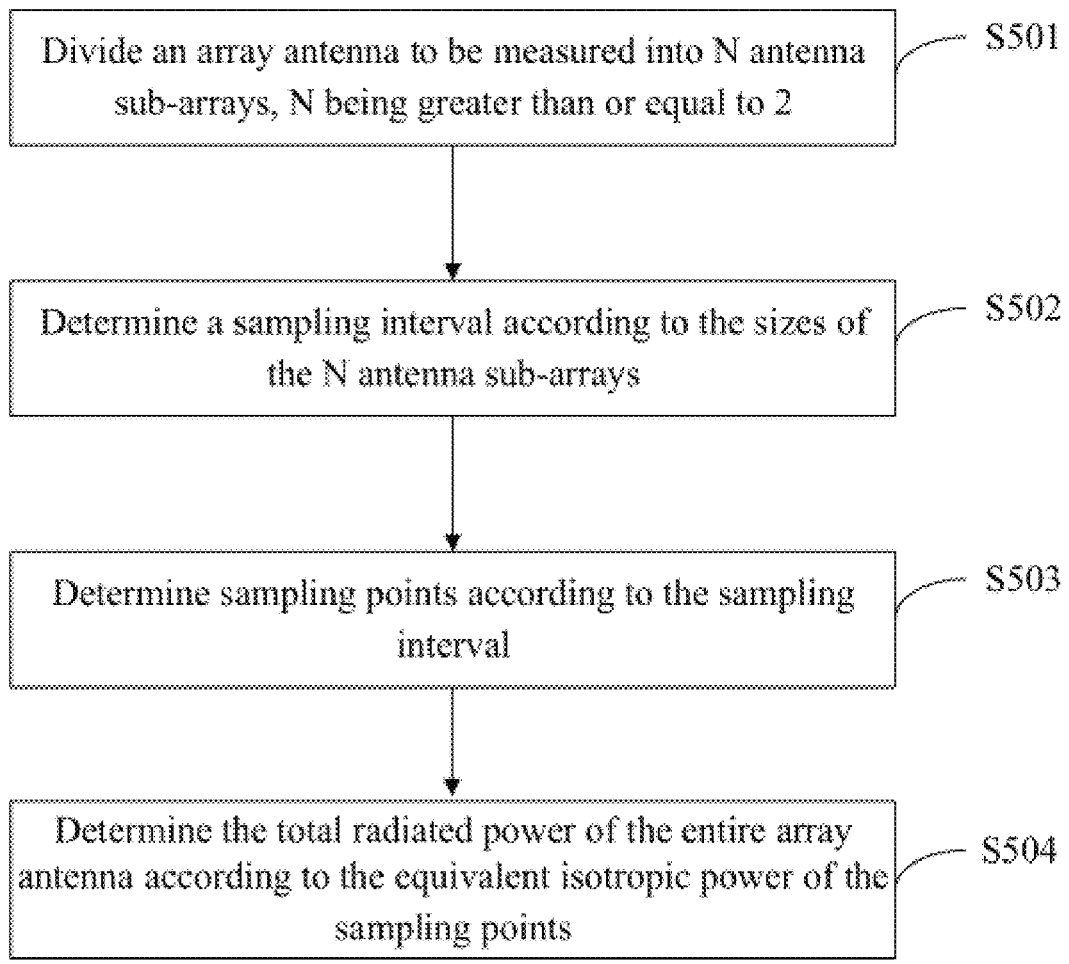
FIG. 5 is a basic flowchart of a method for measuring the total radiated power of an array antenna according to Embodiment one of the present disclosure.

In this embodiment, in order to further decrease the number of sampling points and improve the testing efficiency, a scheme of partitioning the entire antenna array to test the TRP is proposed. Please refer to FIG. 5 for the specific method flow, which includes the following steps of S501 to S504.

At step S501, an array antenna to be measured is divided into N antenna sub-arrays, the N is greater than or equal to 2.

In this embodiment, the array antenna to be measured is divided into N antenna sub-arrays, that is, the array antenna to be measured is partitioned. The partitioning mode includes, but not limited to, separate partitioning or inverse partitioning.

It is to be noted that, the separate partitioning mode is that the array antenna to be measured is arbitrarily divided into N antenna sub-arrays which may be the same or different in size, where N may be an odd number or an even number; and, the inverse partitioning mode is that the array antenna to be measured is divided into N=2$^n$ antenna sub-arrays by dichotomy.

At step S502, a sampling interval is determined according to the sizes of the N antenna sub-arrays.

In this embodiment, the sizes of the antenna sub-arrays are the maximum sizes of the N antenna sub-arrays. In different directions, the maximum sizes may be of the same antenna sub-array or may be of different antenna sub-arrays.

In this embodiment, there are two sampling schemes, one is sampling in an angular space and the other is sampling in a normalized wave vector space. The sampling interval is determined by the Rayleigh resolution. Formulae (2) and (4) show the conversion relationship between the sizes of the antenna sub-arrays and the Rayleigh resolution in the process of sampling in the angular space and the normalized wave vector space, respectively.

It is to be noted that the sampling interval does not exceeds the Rayleigh resolution, that is, the sampling interval is less than or equal to the Rayleigh resolution. When the sampling interval is equal to the Rayleigh resolution, the efficiency of testing the total radiated power of the array antenna is the highest.

At step S503, sampling points are determined according to the sampling interval.

In this embodiment, after the sampling interval is determined, the sampling points can be determined. For the specific way of determining the sampling points, please refer to FIGS. 4(a), 4(b) and 4(c), which will not be repeated here.

It is to be noted that there is a Fourier transformation relationship between the normalized wave vector space and the angular space, for which reference may be made to Formula (1), so sampling in the normalized wave vector space requires the smallest number of sampling points. Since the TRP testing efficiency is higher if there are less sampling points, sampling in the normalized space can also be referred to as an optimal sampling scheme.

At step S504, the total radiated power of the entire array antenna is determined according to the equivalent isotropic radiated power of the sampling points.

In this embodiment, the array antenna is partitioned in two ways, i.e., separate partitioning and inverse partitioning. When separate partitioning is adopted, each antenna sub-array is allowed to transmit power successively at each sampling point, the equivalent isotropic radiated power (EIRP) corresponding to each antenna sub-array is then recorded by a measurement instrument, and the TRP of the entire array antenna is obtained by processing related data. When inverse partitioning is adopted, the array antenna is divided into $N=2^n$ antenna sub-arrays, the antenna sub-arrays are allowed to transmit power simultaneously at each sampling point, and the phase of the antenna sub-arrays is changed by 180° according to the dichotomy, the corresponding EIRPs after N phase changes are recorded, and the TRP of the entire array antenna is obtained by processing related data.

In the method for measuring the total radiated power of an array antenna according to this embodiment of the present disclosure, by partitioning the array antenna to be measured, based on the sampling scheme using Rayleigh resolution, the number of sampling points during the process of measuring the total radiated power of the array antenna is decreased, and the efficiency of testing the total radiated power of the array antenna is greatly improved.

Embodiment II

Based on the above embodiment, in this embodiment of the present disclosure, the method for measuring the total radiated power of an array antenna will be further described in detail by taking separate partitioning as an example.

Figure 6:
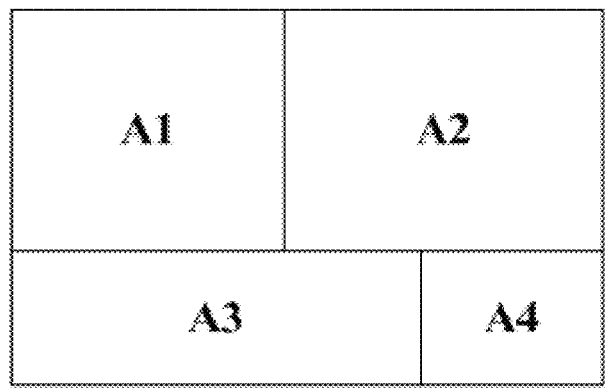
FIG. 6 is a schematic diagram of a scheme of calculating the TRP by separate partitioning according to Embodiment two of the present disclosure.

FIG. 6 is an am embodiment of calculating of the total radiated power (TRP) of an array antenna by separate partitioning, where the array antenna is divided into four antenna sub-arrays, i.e., A1, A2, A3 and A4. The maximum size $D_{z,max}$ in the vertical direction is the size corresponding to the antenna sub-arrays A1 and A2, and the maximum size $D_{y,max}$ in the horizontal direction is the size corresponding to the antenna sub-array A3. The Rayleigh resolution in the y-direction and the z-direction and the sampling points obtained therefrom are determined by the sizes $D_{y,max}$ and $D_{z,max}$.

Figure 7:
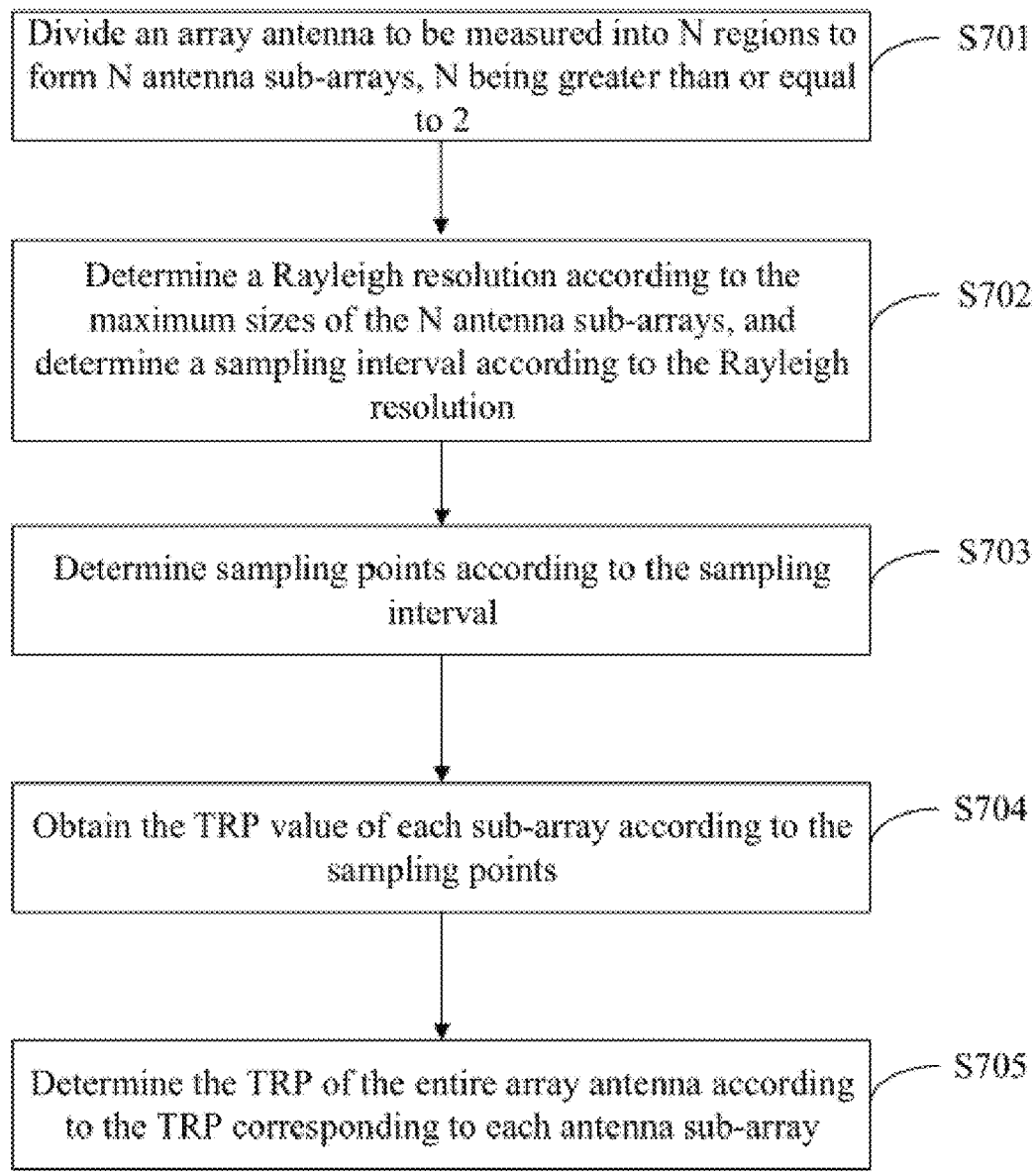
FIG. 7 is a flowchart of a testing method of calculating the TRP by separate partitioning according to Embodiment two of the present disclosure.

FIG. 7 shows a flowchart of a testing method of calculating the TRP by separate partitioning, which includes the following steps of S701 to S705.

At step S701, an array antenna to be measured is divided into N regions to form N antenna sub-arrays, N is greater than or equal to 2.

At step S702, a Rayleigh resolution is determined according to the maximum sizes of the N antenna sub-arrays, and a sampling interval is determined according to the Rayleigh resolution.

In this embodiment, the determination of the maximum sizes of the antenna sub-arrays may have two situations, one is that the maximum sizes in the y-direction and z-direction are of the same antenna sub-array, and the other is that the maximum sizes in the y-direction and z-direction are of different antenna sub-arrays.

In this embodiment, the Rayleigh resolution can be determined in two different spaces, i.e., an angular space and a normalized wave vector space.

The way of determining the Rayleigh resolution in the angular space is:

$$\theta_{r,min} = \frac{180°}{\pi}\sin^{-1}\left(\frac{\lambda}{D_{y,max}}\right), \varphi_{r,min} = \frac{180°}{\pi}\sin^{-1}\left(\frac{\lambda}{D_{z,max}}\right). \quad (5)$$

The way of determining the Rayleigh resolution in the normalized wave vector space is:

$$u_{r,min} = \frac{\lambda}{D_{y,max}}, v_{r,min} = \frac{\lambda}{D_{z,max}}, \quad (6)$$

where $\lambda$ is the signal wavelength; $D_{y,max}$ and $D_{z,max}$ are the maximum antenna sizes corresponding to the array antenna in the y-direction and z-direction, respectively; $\theta_{r,min}$ and $\varphi_{r,min}$ are the minimum Rayleigh resolutions corresponding to each sub-array in $\theta$ and $\varphi$ directions in the angular space, respectively; and, $u_{r,min}$ and $v_{r,min}$ are the minimum Rayleigh resolutions corresponding to each sub-array in y and z directions in the normalized wave vector space, respectively.

It is to be noted that, the sampling interval is determined in such a manner that the sampling interval does not exceed the Rayleigh resolution specifically:

$$\begin{cases} \Delta\theta \leq \theta_{r,min}, \Delta\varphi \leq \varphi_{r,min} \\ \Delta u \leq u_{r,min}, \Delta v \leq v_{r,min} \end{cases}. \quad (7)$$

At step S703, sampling points are determined according to the sampling interval.

For the scheme for sampling in the angular space, the testing system is required to uniformly sample $M_s$ sampling points $(\theta_i, \varphi_i)$ in the angular space $(\theta, \varphi)$ at a sampling interval of $(\Delta\theta, \Delta\varphi)$, where $i=1, 2 \ldots M_s$.

For the scheme for sampling in the normalized wave vector space, the testing system is required to uniformly sample $M_w$ sampling points $(u_i, v_i)$ in the wave vector space $(u, v)$ at a sampling interval of $(\Delta u, \Delta v)$ and the corresponding values $(\theta_i, \varphi_i)$ in the angular space, where $i=1, 2 \ldots M_w$, and the relationship between $(u_i, v_i)$ and $(\theta_i, \varphi_i)$ is transformed by Formula (1).

At step S704, the total radiated power (TRP) value of each antenna sub-array is obtained according to the sampling points.

In this embodiment, at each sampling point, N antenna sub-arrays are allowed to transmit power successively, and the testing instrument records the equivalent isotropic radiated power $EIRP_j$ corresponding to each sub-array, where j=1, 2 . . . N.

It is to be noted that, when allowing the N antenna sub-arrays to transmit power successively is allowing an antenna sub-array to transmit power, the other antenna sub-arrays are turned off, that is, they do not transmit power.

By taking the sampling points being sampled uniformly in the angular space as an example, the EIRP value of each antenna sub-array recorded on each sampling point is $EIRP_{ij}$, where i=1, 2 . . . $M_s$ and j=1, 2 . . . N. Thus, the TRP value of each antenna sub-array can be obtained by the following formula:

$$TRP_j \approx \frac{\Delta\theta\Delta\varphi}{4\pi} \sum_{i=1}^{M_s} EIRP_{ij}\sin(\theta_i), \qquad (8)$$

where $TRP_j$ is the TRP value of the $j^{th}$ sub-array, and $\theta_i$ is the pitch angle corresponding to the $i^{th}$ sampling point.

By taking the sampling points being sampled uniformly in the normalized wave vector space as an example, the EIRP value of each antenna sub-array recorded on each sampling point is $EIRP_{ij}$, where i=1, 2 . . . $M_W$ and j=1, 2 . . . N. Thus, the TRP value of each antenna sub-array can be obtained by the following formula:

$$TRP_j \approx \frac{\Delta u \Delta v}{4\pi} \sum_{i=1}^{M_x} \frac{EIRP_{ij}}{\sin(\theta_i)\cos(\varphi_i)}, \qquad (9)$$

where $TRP_j$ is the TRP value of the $j^{th}$ sub-array, the angle $(\theta_i, \varphi_i)$ is the value corresponding to the $i^{th}$ sampling point $(u_i, v_i)$, and $TRP_j$ and $(\theta_i, \varphi_i)$ are connected by the transformation formula (1).

At step S705, the TRP of the entire array antenna is determined according to the TRP corresponding to each antenna sub-array.

In this embodiment, the TRP value corresponding to each antenna sub-array can be represented by $TRP_j$ (where j=1, 2 . . . N), the total radiated power of the entire array antenna is:

$$TRP \approx \sum_{j=1}^{N} TRP_j. \qquad (10)$$

In this embodiment of the present disclosure, the method for measuring the TRP of the entire array antenna is further described in detail by way of specific embodiments by taking sampling in the angular space and sampling in the normalized wave vector space as examples.

Example I

In this example, the array antenna has a size of 8λ×8λ, where λ represents the wavelength. The array antenna to be measured is divided into two antenna sub-arrays, specifically left and right identical antenna sub-arrays, and the TRP sampling is performed in an angular space. The method for measuring the TRP of the entire array antenna includes the following steps of S701 to S705.

At step S701, an array antenna to be measured is divided into N regions to form N antenna sub-arrays, N being greater than or equal to 2.

Specifically, an 8λ×8λ array antenna to be measured is divided into left and right identical 4λ×8λ sub-arrays, and N is determined to be 2.

At step S702, a Rayleigh resolution is determined according to the maximum sizes of the N antenna sub-arrays, and a sampling interval is determined according to the Rayleigh resolution.

Specifically, since the full array antenna consists of left and right identical antenna sub-arrays, the maximum sizes $D_{y,max}$ and $D_{z,max}$ corresponding to the antenna sub-arrays in the y-direction and the z-direction are 4λ and 8λ, respectively. By substituting into Formula (5), it is can be known that the corresponding Rayleigh resolution $(\theta_{r,min}, \varphi_{r,min})$ is (14.4°, 7.1°). In accordance with Formula (7), the sampling intervals in θ and φ directions can be set as 14.4° and 7.1°.

At step S703, sampling points are determined according to the sampling interval.

In this example, points are uniformly sampled in the angular space, and the intervals between points in θ and φ directions are 14.4° and 7.1°, respectively. The sampling may start in a normal direction of the array antenna, or may be deviated from the normal direction. Since backward radiation can be ignored for this high-gain array antenna, scanning can be performed on only a front half sphere of the array antenna. Thus, the number $M_s$ of sampling points determined in this way is about 300.

At step S704, the total radiated power (TRP) value of each antenna sub-array is obtained according to the sampling points.

Specifically, the tester 250 controls the turntable 220 to reach a specified sampling point, and left and right sub-arrays are switched at each sampling point i to transmit power in turn. A frequency domain instrument 240 records the equivalent isotropic radiated power $EIRP_{ij}$ corresponding to each sub-array, where i=1, 2 . . . $M_s$, and j=1, 2. The $TRP_1$ and $TRP_2$ of the left and right sub-arrays can be obtained by Formula (8).

At step S705, the TRP of the entire array antenna is determined according to the TRP corresponding to each antenna sub-array.

In this example, the TRP of the entire array antenna satisfies the following: $TRP=TRP_1+TRP_2$.

Example II

In this example, the array antenna has a size of 8λ×8λ, where λ represents the wavelength. The array antenna to be measured is divided into two antenna sub-arrays, specifically left and right identical antenna sub-arrays, and the TRP sampling is performed in a normalized wave vector space. The method for measuring the TRP of the entire array antenna includes the following steps of S701 to S705.

At step S701, an array antenna to be measured is divided into N regions to form N antenna sub-arrays, N is greater than or equal to 2.

Specifically, an 8λ×8λ array antenna to be measured is divided into left and right identical 4λ×8λ sub-arrays, and N is determined to be 2.

At step S702, a Rayleigh resolution is determined according to the maximum sizes of the N antenna sub-arrays, and a sampling interval is determined according to the Rayleigh resolution.

Specifically, since the full array antenna may consist of left and right identical antenna sub-arrays, the maximum sizes $D_{y,max}$ and $D_{z,max}$ corresponding to the antenna sub-arrays in the y-direction and the z-direction are 4λ and 8λ, respectively. By substituting into Formula (6), it is can be known that the corresponding Rayleigh resolution ($u_{r,min}$, $v_{r,min}$) is (0.25, 0.125). In accordance with Formula (7), the sampling intervals in u and v directions can be set as 0.25 and 0.125.

At step S703, sampling points are determined according to the sampling interval.

In this example, points are uniformly sampled in the wave vector space, and the intervals between points in u and v directions are 0.25 and 0.125, respectively. The sampling may start in a normal direction of the array antenna, or may be deviated from the normal direction. The sampling points uniformly distributed in the wave vector space are located within a unit circle from the central point, which is determined by the propagation characteristics. Since backward radiation can be ignored for this high-gain array antenna, scanning can be performed on only a front half sphere of the array antenna. Thus, the number $M_w$ of sampling points determined in this way is about 100. The corresponding values of the points of the wave vector space in the angular space are obtained by the transformation Formula (1).

At step S704, the TRP value of each antenna sub-array is obtained according to the sampling points.

Specifically, the tester 250 controls the turntable 220 to reach a point in the angular space, and left and right sub-arrays are switched at each sampling point i to transmit power in turn. A frequency domain instrument 240 records the equivalent isotropic radiated power $EIRP_{ij}$ corresponding to each sub-array, where i=1, 2 . . . $M_s$, and j=1, 2. The $TRP_1$ and $TRP_2$ of the left and right sub-arrays can be obtained by Formula (9).

At step S705, the TRP of the entire array antenna is determined according to the TRP corresponding to each antenna sub-array.

In this example, the TRP of the entire array antenna satisfies the following: $TRP=TRP_1+TRP_2$.

In the method for measuring the total radiated power of an array antenna according to this embodiment of the present disclosure, by partitioning the array antenna to be measured in a separate partitioning manner, it is ensured that no aliasing will occur in the antenna sub-arrays and the accuracy of the TRP result of the antenna sub-arrays can be ensured. The switching time for sub-arrays is two orders of magnitude shorter than the waiting time of the turntable and thus can be ignored, so that the number of sampling points is decreased, and the efficiency of testing the TRP of the array antenna is greatly improved. Since there is a Fourier transformation relationship between the field distribution of the wave vector space and the current distribution of the antenna surface, sampling in the wave vector space requires the smallest number of points. The smaller the number of the sampling points is, the higher the TRP testing efficiency is.

Embodiment III

In this embodiment of the present disclosure, the method for measuring the total radiated power of an array antenna will be further described in detail by taking inverse partitioning as an example.

Figure 8A:
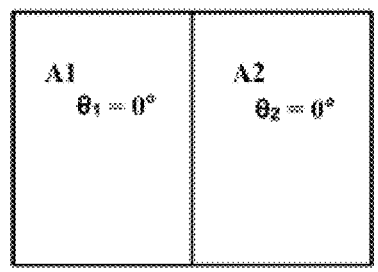
FIGS. 8(a), (b) and (c) are schematic diagrams of a scheme of calculating the TRP by inverse partitioning according to Embodiment three of the present disclosure.
Figure 8A:
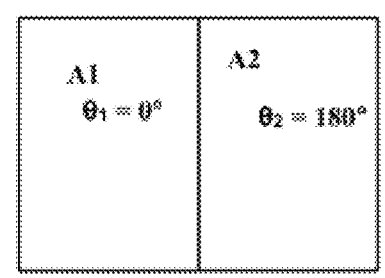

FIG. 8(a) is a schematic diagram of calculating the total radiated power (TRP) of the array antenna by dichotomy.

The entire array antenna is divided into two antenna sub-arrays A1 and A2 of the same size. By sampling at a sampling interval corresponding to the sizes of the antenna sub-arrays, aliasing will occur in the two antenna sub-array regions, resulting in a deviation between a calculated TRP value and an actual value. 811 denotes a situation where two antenna sub-arrays are kept at a phase of 0, and 812 denotes a situation where two antenna sub-arrays have a phase difference of 180°. That is, compared with the situation 811, only one inversion operation is performed in the situation 812. This operation is very easily realized in an active phased array antenna. In this sampling way, the TRP obtained by testing the situation 811 is $TRP_1$, and the TRP obtained by testing the situation 812 is $TRP_2$. Although the $TRP_1$ and $TRP_2$ cannot directly represent the TRP value of the full array antenna, but it can be proved that the TRP value of the full array antenna can be:

$$TRP = \frac{TRP_1 + TRP_2}{2}. \tag{11}$$

This result can be obtained from the coherence characteristics of the field.

In the way shown in Formula (11), the Rayleigh resolution corresponding to the sizes of the antenna sub-arrays can be sampled, so that the sampling points are reduced by half. Moreover, since phase shifting can be ignored in comparison to the waiting time of the test point, generally, the testing efficiency can be doubled in the way of calculating TRP by dichotomy.

Figures 8B, 8C:
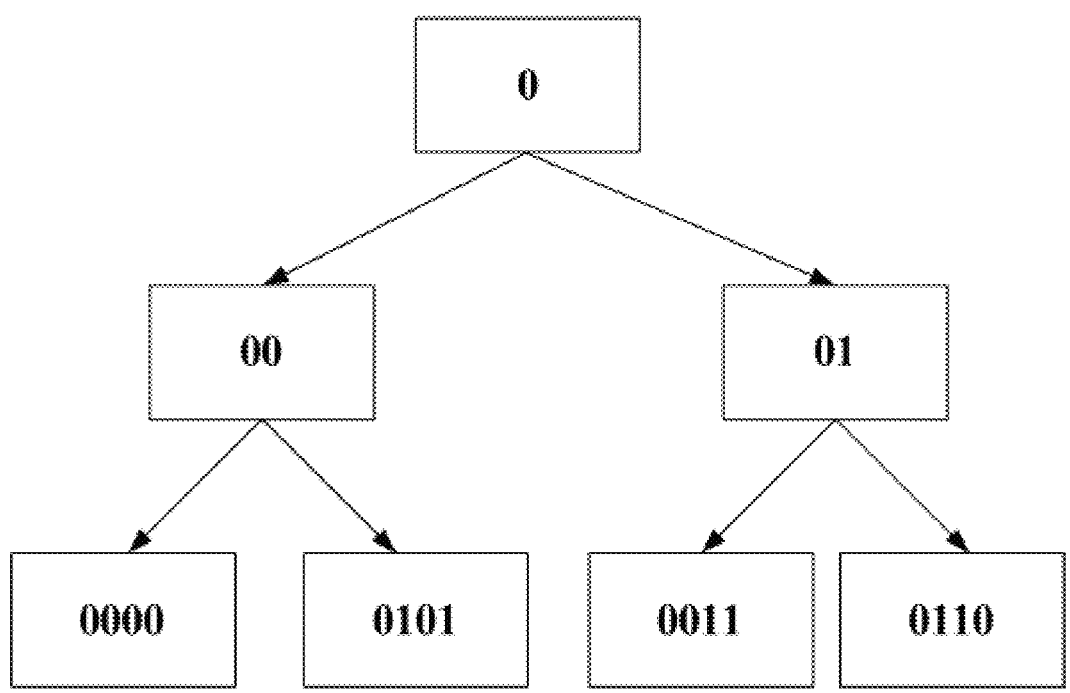

FIG. 8(b) shows a schematic diagram of a scheme of calculating TRP by quartering.

The entire array antenna is divided into four antenna sub-arrays A1, A2, A3 and A4 of the same size. By sampling at a sampling interval corresponding to the sizes of the antenna sub-arrays, aliasing will occur in the four antenna sub-array regions, resulting in a deviation between a calculated TRP value and an actual value. 821 denotes a situation where two antenna sub-arrays are kept at a phase of 0. 822 denotes a situation where left and right antenna sub-arrays have a phase difference of 180. That is, compared with the situation 821, only one inversion operation is performed on two right antenna sub-arrays in the situation 822. 823 denotes a situation where upper and lower antenna sub-arrays have a phase difference of 180. That is, compared with the situation 821, only one inversion operation is performed on two lower antenna sub-arrays in the situation 823. 824 denotes a situation where two diagonal antenna sub-arrays have a phase difference of 180. That is, compared with the situation 822, only one inversion operation is performed on two lower antenna sub-arrays in the situation 824. This phase shifting operation can be very easily realized in an active phased array antenna. In this sampling way, TRPs obtained by testing the situations 821, 822, 823 and 824 are $TRP_1$, $TRP_2$, $TRP_3$ and $TRP_4$. Although the $TRP_1$, $TRP_2$, $TRP_3$ and $TRP_4$ cannot directly represent the TRP value of the full array antenna, but it can be proved that the TRP value of the full array antenna can be:

$$TRP = \frac{TRP_1 + TRP_2 + TRP_3 + TRP_4}{4}. \tag{12}$$

This result can be obtained from the coherence characteristics of the field.

In the way shown in Formula (12), the Rayleigh resolution corresponding to the sizes of the antenna sub-arrays can be sampled, so that the number of sampling points is reduced to ¼ of the original number of sampling points. Moreover, since phase shifting can be ignored in comparison to the waiting time of the test point, generally, the testing efficiency can be improved by 3 times in the way of calculating TRP by quartering.

FIG. 8(c) shows a schematic diagram of a scheme of calculating TRP by N partitioning.

It can be observed from FIGS. 8(a) and (b) that the antenna sub-arrays are divided by dichotomy. In the case of four partitions, the antenna sub-arrays can be expressed as 0000, 0101, 0011 and 0110, where 1 represents an inversion operation. In the case of more partitions, expansion can be carried out on this basis. The array antenna can be divided into $N=2^n$ identical antenna sub-arrays, and then sampled at a sampling interval corresponding to the sizes of the antenna sub-arrays to obtain a TRP value corresponding to each inversion, i.e., $TRP_j$, where $j=1, 2 \ldots N$. It can be proved that the TRP value of the full array antenna is:

$$TRP = \frac{1}{N}\sum_{j=1}^{N} TRP_j. \quad (13)$$

In the way shown in Formula (13), the Rayleigh resolution corresponding to the sizes of the antenna sub-arrays can be sampled, so that the number of sampling points is reduced to 1/N of the original number of sampling points. Moreover, since phase shifting can be ignored in comparison to the waiting time of the test point, generally, the testing efficiency can be improved by N−1 times in the way of calculating TRP by N partitioning.

It is to be noted that, although the situation where the array antenna is divided into antenna sub-arrays of the same size is described above, the antenna sub-arrays may also be different in size. How to specifically divide the array antenna depends on the actual situation and actual needs.

Figure 9:
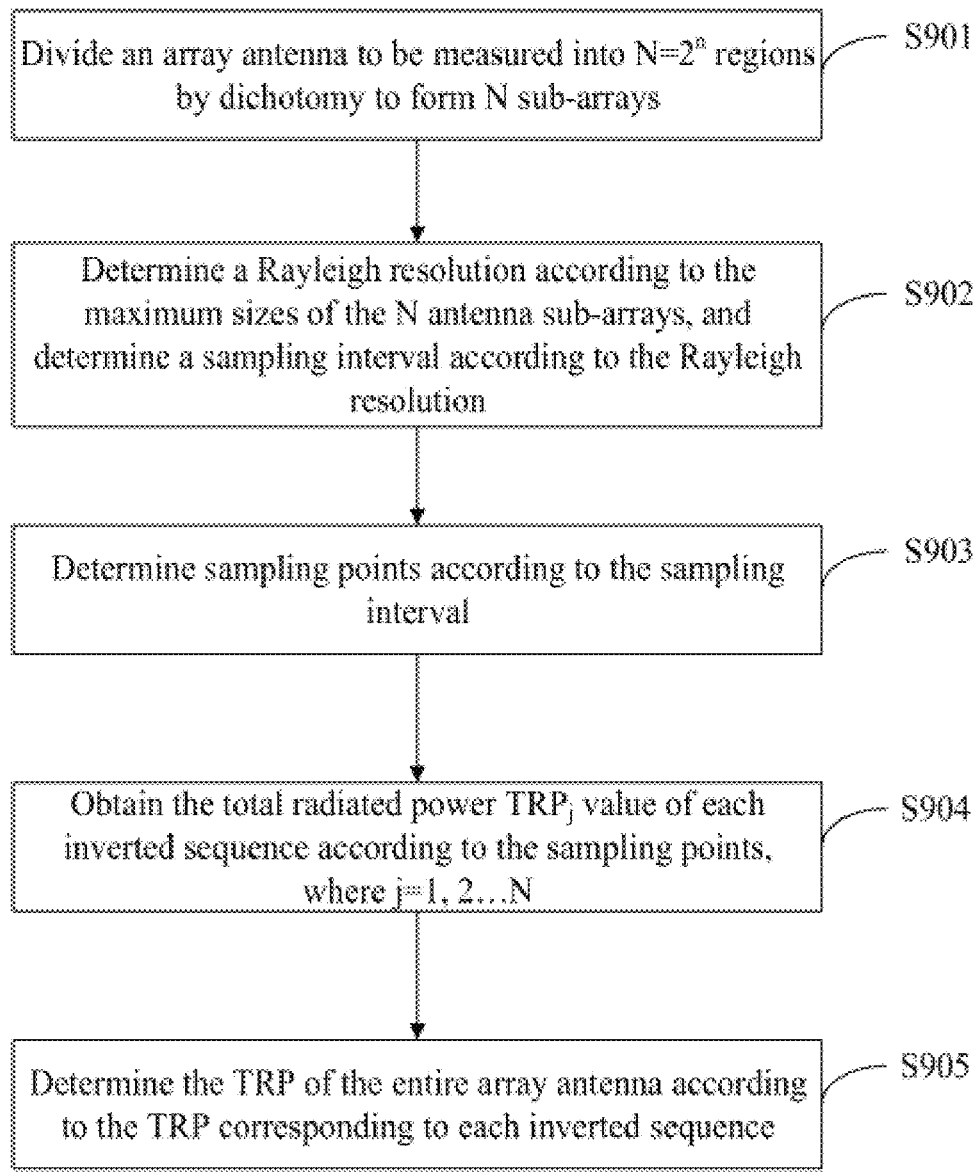
FIG. 9 is a flowchart of a testing method of calculating the TRP by inverse partitioning according to Embodiment three of the present disclosure.

FIG. 9 shows a flowchart of a testing method of calculating the TRP by inverse partitioning, which includes the followings steps of S901 to S905.

At step S901, an array antenna is divided into $N=2^n$ regions by dichotomy to form N sub-arrays.

At step S902, a Rayleigh resolution is determined according to the maximum sizes of the N antenna sub-arrays, and a sampling interval is determined according to the Rayleigh resolution.

In this embodiment, the determination of the maximum sizes of the antenna sub-arrays may have two situations, one is that the maximum sizes in the y-direction and z-direction are of the same antenna sub-array, and the other is that the maximum sizes in the y-direction and z-direction are of different antenna sub-arrays.

In this embodiment, the Rayleigh resolution can be determined from two different spaces, i.e., an angular space and a normalized wave vector space. The determination of the Rayleigh resolution in the angular space and the Rayleigh resolution in the normalized wave vector space can be realized by Formulae (5) and (6).

In this embodiment, the sampling interval in the angular space and the normalized wave vector can be determined by Formula (7).

At step S903, sampling points are determined according to the sampling interval.

For the scheme of sampling in the angular space, the testing system is required to uniformly sample $M_s$ sampling points $(\theta_i, \varphi_i)$ in the angular space $(\theta, \varphi)$ at a sampling interval of $(\Delta\theta, \Delta\varphi)$, where $i=1, 2 \ldots M_s$.

For the scheme of sampling in the normalized wave vector space, the testing system is required to uniformly sample $M_W$ sampling points $(u_i, v_i)$ in the wave vector space $(u, v)$ at a sampling interval of $(\Delta u, \Delta v)$ and the corresponding values $(\theta_i, \varphi_i)$ in the angular space, where $i=1, 2 \ldots M_w$, and the relationship between $(u_i, v_i)$ and $(\theta_i, \varphi_i)$ is transformed by Formula (1).

At step S904, the total radiated power $TRP_j$ value of an inverted sequence is obtained according to the sampling points, where $j=1, 2 \ldots N$.

In this embodiment, at each sampling point, all antenna sub-arrays are allowed to transmit power simultaneously, each sub-array is numbered, and the inverted sequence is obtained in the way shown in FIG. 8(c). The tester records the equivalent isotropic radiated power $EIRP_j$ of the inverted sequence, where $j=1, 2 \ldots N$.

When the sampling points are obtained by uniformly sampling in the angular space, the EIRP value of each inverted sequence recorded at each sampling point is $EIRP_{ij}$ (where $i=1, 2 \ldots M_s$, and $j=1, 2 \ldots N$), and the TRP value of each inverted sequence can be obtained by Formula (8).

It is to be noted that the $TRP_j$ in Formula (9) refers to the TRP value of the $j^{th}$ inverted sequence.

When the sampling points are obtained by uniformly sampling in the normalized wave vector space, the EIRP value of each inverted sequence recorded at each sampling point is $EIRP_{ij}$ (where $i=1, 2 \ldots M_w$, and $j=1, 2 \ldots N$), and the TRP value of each sub-array can be obtained by Formula (9). It is to be noted that the $TRP_j$ in Formula (9) refers to the TRP value of the $j^{th}$ inverted sequence.

At step S905, the TRP of the entire array antenna is determined according to the TRP corresponding to each inverted sequence.

Specifically, the TRP value corresponding to each inverted sequence can be expressed as $TRP_j$ (where $j=1, 2 \ldots N$), the TRP of the entire array can be obtained by Formula (13).

In this embodiment of the present disclosure, the method for measuring the TRP of the entire array antenna is further described in detail by way of specific embodiments by taking sampling in the angular space and sampling in the normalized wave vector space as examples.

Example I

In this example, the array antenna has a size of $8\lambda \times 8\lambda$, where $\lambda$ represents the wavelength. The array antenna is divided into two antenna sub-arrays, specifically left and right identical antenna sub-arrays, and the TRP sampling is performed in the angular space. The method for measuring the TRP of the entire array antenna includes the following steps of S901 to S905.

At step S901, an array antenna is divided into $N=2^n$ regions by dichotomy to form N sub-arrays.

In this example, an $8\lambda \times 8\lambda$ array antenna is divided into left and right identical $4\lambda \times 8\lambda$ antenna sub-arrays, and it is determined that N is 2 and $n=1$.

At step S902, a Rayleigh resolution is determined according to the maximum sizes of the N antenna sub-arrays, and a sampling interval is determined according to the Rayleigh resolution.

In this embodiment, since the full array antenna may consist of left and right identical antenna sub-arrays, the maximum sizes $D_{y,max}$ and $D_{z,max}$ corresponding to the sub-arrays in the y-direction and the z-direction are $4\lambda$ and $8\lambda$, respectively. By substituting into Formula (5), it is can be known that the corresponding Rayleigh resolution ($\theta_{r,min}$, $\varphi_{r,min}$) is (14.4°, 7.1°). In accordance with Formula (7), the sampling intervals in θ and φ directions can be set as 14.4° and 7.1°.

At step S903, sampling points are determined according to the sampling interval.

In this example, points are uniformly sampled in the angular space, and the intervals between points in θ and φ directions are 14.4° and 7.1°, respectively. The sampling may start in a normal direction of the array antenna, or may be deviated from the normal direction. Since the backward radiation can be ignored for this high-gain array antenna, scanning can be performed on only a front half sphere of the array antenna. Thus, the number $M_s$ of sampling points determined in this way is about 300.

At step S904, the total radiated power $TRP_j$ value of an inverted sequence is obtained according to the sampling points, where j=1, 2 . . . N.

The tester 250 controls the turntable 220 to reach a specified sampling point. At each sampling point i, two inverted sequences are applied to left and right antenna sub-arrays. One sequence makes the two antenna sub-arrays have the same phase, while the other sequence makes the two antenna sub-arrays have opposite phases. The frequency domain instrument 240 records the equivalent isotropic radiated power $EIRP_{ij}$ corresponding to each inverted sequence, where i=1, 2 . . . $M_s$, and j=1, 2. The $TRP_1$ and $TRP_2$ of the two inverted sequences can be obtained by Formula (8).

At step S905, the TRP of the entire array antenna is determined according to the TRP corresponding to each inverted sequence.

In this example, the TRP of the entire array antenna satisfies the following:

$$TRP = \frac{TRP_1 + TRP_2}{2}.$$

Example II

In this example, the array antenna has a size of 8λ×8λ, where λ represents the wavelength. The array antenna to be measured is divided into two antenna sub-arrays, specifically left and right identical antenna sub-arrays, and the TRP sampling is performed in a normalized wave vector space. The method for measuring the TRP of the entire array antenna includes the following steps of S901 to S905.

At step S901, an array antenna is divided into $N=2^n$ regions by dichotomy to form N sub-arrays.

In this example, an 8λ×8λ array antenna is divided into left and right identical 4λ×8λ antenna sub-arrays, and it is determined that N is 2 and n=1.

At step S902, a Rayleigh resolution is determined according to the maximum sizes of the N antenna sub-arrays, and a sampling interval is determined according to the Rayleigh resolution.

In this embodiment, since the full array antenna may consist of left and right identical antenna sub-arrays, the maximum sizes $D_{y,max}$ and $D_{z,max}$ corresponding to the antenna sub-arrays in the y-direction and the z-direction are 4λ and 8λ, respectively. By substituting into Formula (6), it is can be known that the corresponding Rayleigh resolution ($u_{r,min}$, $v_{r,min}$) is (0.25, 0.125). In accordance with Formula (7), the sampling intervals in u and v directions can be set as 0.25 and 0.125.

At step S903, sampling points are determined according to the sampling interval.

In this example, points are uniformly sampled in the wave vector space, and the intervals between points in u and v directions are 0.25 and 0.125, respectively. The sampling may start in a normal direction of the array antenna, or may be deviated from the normal direction. The sampling points uniformly distributed in the wave vector space are located within a unit circle from the central point, which is determined by the propagation characteristics. Since backward radiation can be ignored for this high-gain array antenna, scanning can be performed on only a front half sphere of the array antenna. Thus, the number $M_w$ of sampling points determined in this way is about 100. The corresponding values of the points of the wave vector space in the angular space can be obtained by the transformation Formula (1).

At step S904, the total radiated power $TRP_j$ value of an inverted sequence is obtained according to the sampling points, where j=1, 2 . . . N.

The tester 250 controls the turntable 220 to reach a specified sampling point. At each sampling point i, two inverted sequences are applied to left and right antenna sub-arrays. One sequence makes the two antenna sub-arrays have the same phase, while the other sequence makes the two antenna sub-arrays have opposite phases. The frequency domain instrument 240 records the equivalent isotropic radiated power $EIRP_{ij}$ corresponding to each inverted sequence, where i=1, 2 . . . $M_w$, and j=1, 2. The $TRP_1$ and $TRP_2$ of the two inverted sequences can be obtained by Formula (9).

At step S905, the TRP of the entire array antenna is determined according to the TRP corresponding to each inverted sequence.

In this example, the TRP of the entire array antenna satisfies the following:

$$TRP = \frac{TRP_1 + TRP_2}{2}.$$

In the method for measuring the total radiated power of an array antenna according to this embodiment of the present disclosure, by partitioning the array antenna to be measured in an inverse partitioning manner, based on the Rayleigh sampling rate of the full array antenna in the angular space and the wave vector space, the sub-array switching time is generally two orders of magnitude shorter than the waiting time of the turntable and thus can be ignored, so that the calculation efficiency can be improved. Moreover, with this partitioning method, the testing efficiency is improved by reducing the number of sampling points. The efficiency of this sampling scheme is directly proportional to the number of partitions.

Embodiment IV

This embodiment further provides an apparatus for measuring the total radiated power of an array antenna, including a partition determination module, a sampling interval determination module, a sampling point determination module and a total radiated power determination module. The apparatus is configured to implement the testing method described in the above embodiments.

Figure 10:
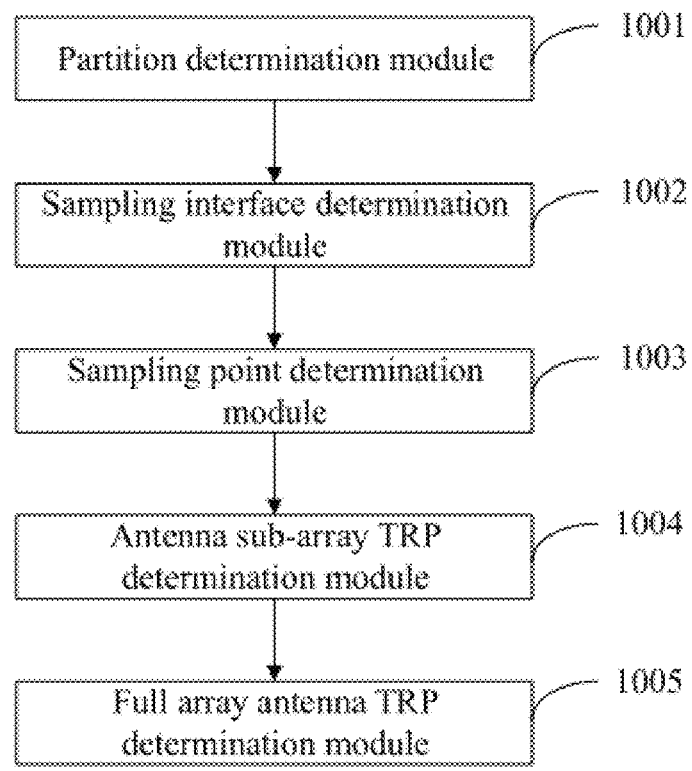
FIG. 10 is a schematic diagram of a testing apparatus of calculating the TRP by separate partitioning according to Embodiment four of the present disclosure.

FIG. 10 shows a schematic diagram of a testing apparatus of calculating the TRP by separate partitioning. The apparatus includes:

- a partition determination module 1001 configured to divide an array antenna to be measured into N regions to form N antenna sub-arrays, where N is greater than or equal to 2;
- a sampling interval determination module 1002 configured to make the sampling interval not greater than a Rayleigh resolution corresponding to the maximum size of each antenna sub-array;
- a sampling point determination module 1003 configured to determine the positions of sampling points according to the sampling interval; and
- a total radiated power determination module, including an antenna sub-array TRP determination module 1004 configured to determine the TRP value of each antenna sub-array according to the sampling points, and a full array antenna TRP determination module 1005 configured to determine the TRP value of the full array antenna according to the TRP of the antenna sub-arrays.

Figure 11:
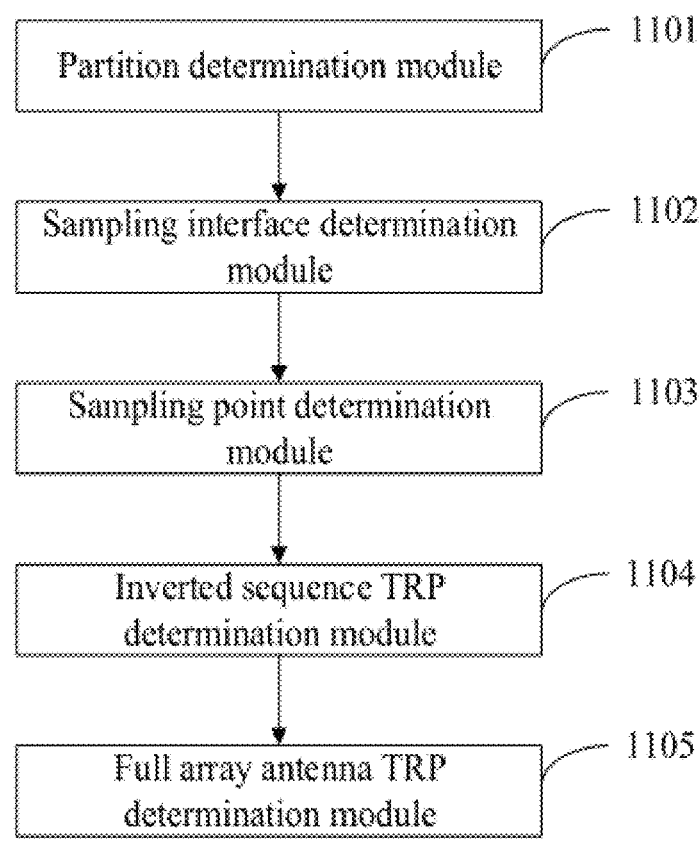
FIG. 11 is a schematic diagram of a testing apparatus of calculating the TRP by inverse partitioning according to Embodiment four of the present disclosure.

FIG. 11 shows a schematic diagram of a testing apparatus of calculating the TRP by inverse partitioning. The apparatus includes:

- a partition determination module 1101 configured to divide an array antenna into $N=2^n$ regions by dichotomy to form N sub-arrays;
- a sampling interval determination module 1102 configured to make the sampling interval not greater than the Rayleigh resolution corresponding to the maximum size of each antenna sub-array;
- a sampling point determination module 1103 configured to determine the positions of sampling points according to the sampling interval; and
- a total radiated power determination module, including an inverted sequence TRP determination module 1104 configured to determine the TRP value of each inverted sequence according to the sampling points, and a full array antenna TRP determination module 805 configured to determine the TRP value of the full array antenna according to the TRP of the inverted sequences.

Embodiment V

This embodiment further provides a system for measuring the total radiated power of an array antenna. The system is configured to implement at least one of the steps in the method for measuring the total radiated power of an array antenna described in the above embodiments. Specifically referring to FIG. 2, the system includes an equipment under test (EUT) 210 fixed on a turntable, a testing antenna system 230, a power detector 240 and a tester 250. The EUT 210 includes an array antenna 212 and a radio remote unit 211 which are integrated together. The power detector is connected to the testing antenna system 230. The tester 250 is connected to the EUT 210, the turntable 220, the testing antenna system 230 and the power detector 240, respectively.

The EUT 210 is placed and fixed on the turntable 220, and the turntable 220 can rotate in a horizontal plane and a pitching plane.

The testing antenna system 230 includes a testing antenna 231, an antenna fixation bracket 232 and a testing cable 233. The testing antenna 231 may be a single antenna, or may be a plurality of antennas. The antenna fixation bracket 232 is configured to fix the testing antenna 231, and can move in a three-dimensional space. The testing antenna 231 is connected to the power detector 240 through the testing cable 233. The power detector 240 may be a vector network analyzer, a spectrometer, a power meter, etc.

The EUT 210, the turntable 220, the antenna fixation bracket 232 and the power detector 240 are all connected to the tester 250. The tester 250 may be configured to control the transmitting/receiving the EUT 210, the rotation of the turntable 220, the movement of the antenna fixation bracket 232 and the transmitting/receiving of the power detector 240, record and process related test data including EIRP values, and record logs.

During the whole test process, the full anechoic chamber environment is isolated from the external environment by a wave absorbing material 260 and a dark chamber wall 270 to simulate an infinite space.

In this embodiment, when the TRP is calculated by separate partitioning, the array antenna in the EUT 210 can be divided into N antenna sub-arrays, where N is greater than or equal to 2. The switching of the antenna sub-arrays includes adjusting the amplitude, and turning on or off the antenna-sub-arrays.

The tester is configured to: determine array antenna partitions and antenna sub-arrays, the maximum sizes of the antenna sub-arrays and the Rayleigh resolution corresponding to the antenna sub-array having the maximum size; determine a sampling interval for sampling points according to the Rayleigh resolution; and, determine uniform sampling points in an angular space or a wave vector space according to the sampling interval, control the EUT 210, the turntable 220, the testing antenna system 230 and the power detector 240 to measure the equivalent isotropic radiated power (EIRP) corresponding to each antenna sub-array at the sampling points, and determine the TRP according to the EIRP.

Specifically, the tester is configured to: determine N partitions of the active array antenna 212 to form N sub-arrays; determine a sampling interval according to the maximum sizes of all antenna sub-arrays; determine sampling points according to the sampling interval; control the EUT 210, the turntable 220, the testing antenna system 230 and the power detector 240 to measure equivalent isotropic radiated power (EIRP) of each antenna sub-array at the sampling points; determine the TRP of each antenna sub-array according to the EIRP; and determine the TRP of the full array antenna according to a TRP value of each antenna sub-array.

In this embodiment, when the TRP is calculated by inverse partitioning, the array antenna in the EUT 210 is divided into $N=2^n$ antenna sub-arrays by dichotomy. The control of the antenna sub-arrays includes adjusting the phase or symbol.

The tester is configured to: determine array antenna partitions and antenna sub-arrays, the maximum sizes of the antenna sub-arrays and a Rayleigh resolution corresponding to the antenna sub-array having the maximum size; determine a sampling interval for sampling points according to the Rayleigh resolution; and, determine uniform sampling points in an angular space or a wave vector space according to the sampling interval, control the EUT 210, the turntable 220, the testing antenna system 230 and the power detector 240 to invert the antenna sub-arrays according to the dichotomy for $N=2^n$ times, measure the equivalent isotropic radiated power (EIRP) corresponding to each inversion, and determine the TRP according to the EIRP.

Specifically, the tester is configured to: determine $N=2^n$ partitions of the active array antenna 212 to form N sub-arrays; determine a sampling interval according to the maximum sizes of all antenna sub-arrays; determine sampling points according to the sampling interval; control the EUT 210, the turntable 220, the testing antenna system 230 and the power detector 240 to measure equivalent isotropic radiated power (EIRP) of each inverted sequence at the sampling points; determine the TRP of each inverted sequence according to the EIRP; and determine the TRP of the full array antenna according to the TRP value of each inverted sequence.

Figure 12:
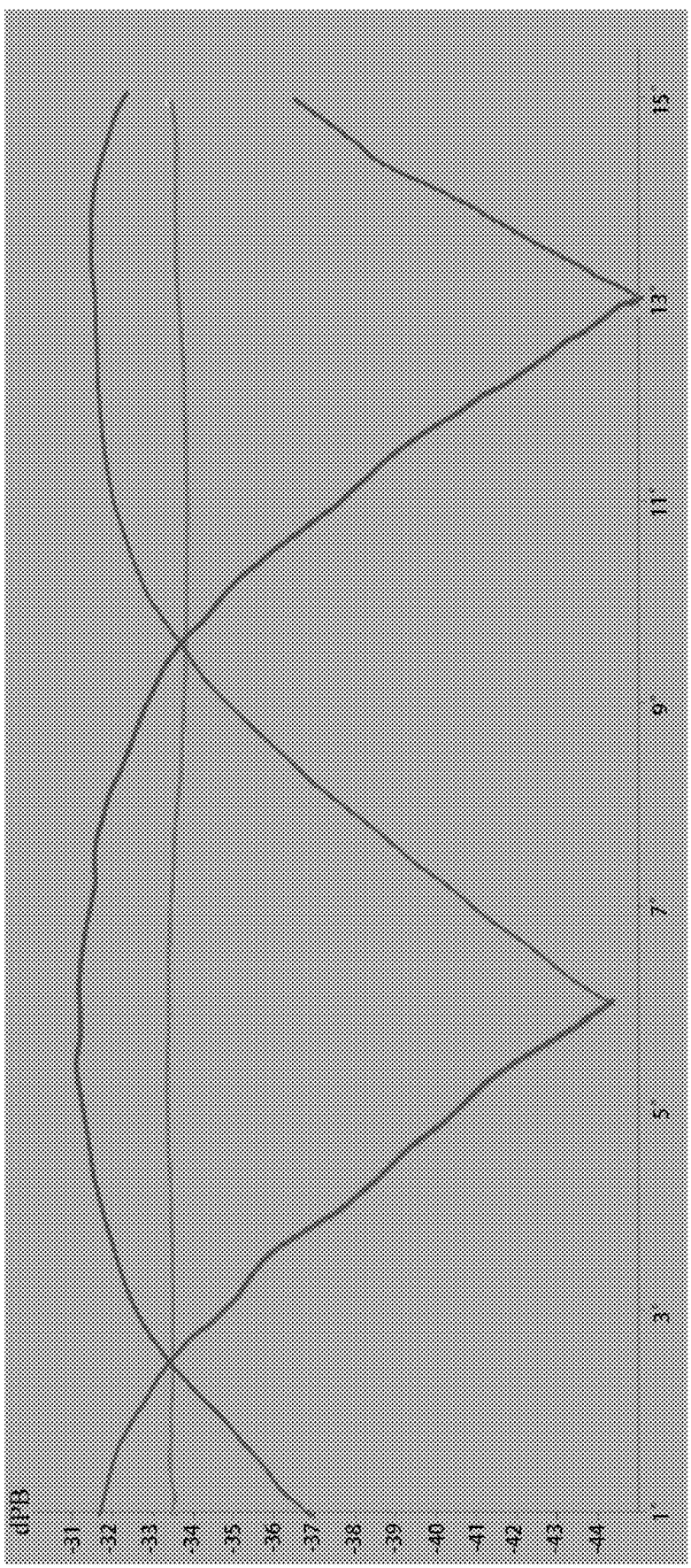
FIG. 12 shows test results of the testing scheme of calculating the TRP by inverse partitioning in the system according to Embodiment five of the present disclosure.

FIG. 12 shows experimental verification results of the use of the partition inversion algorithm in this system. In this experiment, a 16×8 array is partitioned and inverted to form two 8×8 sub-arrays. Curve 1 and curve 2 are the under-sampled measurement data of the patterns of an in-phase codebook and an anti-phase codebook, respectively. Under-sampling results in a large fluctuation of the measurement results. Curve 3 shows synthesis of the two data, where the result of calculation is very stable, and the result of measurement is consistent with the result of standard sampling measurement.

Embodiment VI

Figure 13:
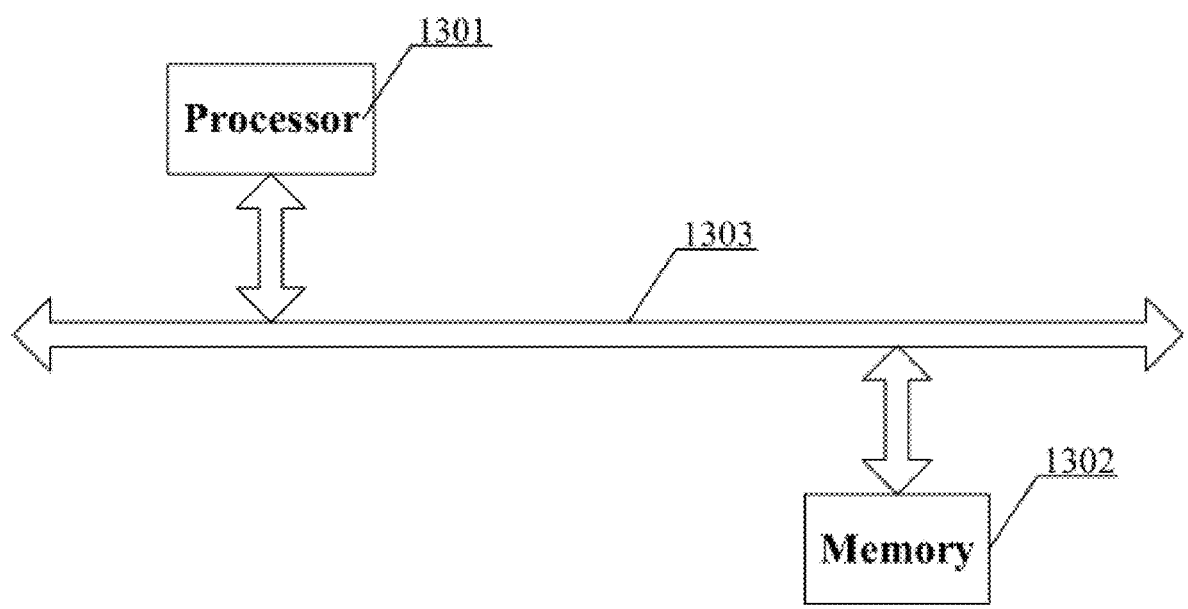
FIG. 13 is a schematic diagram of a measuring terminal device according to Embodiment six of the present disclosure.

As shown in FIG. 13, this embodiment further provides a terminal device for measuring the total radiated power of an array antenna, including a processor 1301, a memory 1302 and a communication bus 1303.

The communication bus 1303 is configured to realize the communication between the processor 1301 and the memory 1302. The memory 1302 has computer programs stored thereon. The processor 1301 is configured to execute one or more computer programs stored in the memory 1302 to implement at least one of the steps in the method for measuring the total radiated power of an array antenna described in Embodiments one to three.

Embodiment VII

This embodiment further provides a computer-readable storage medium, including volatile or non-volatile and moveable or non-moveable mediums implemented in any method or technology for storing information (such as computer-readable instructions, data structures, computer program modules or other data). The computer-readable storage medium includes, but not limited to, random access memories (RAMs), read-only memories (ROMs), electrically erasable programmable read only memories (EE-PROMs), flash memories or other memory technologies, compact disc read-only memories (CD-ROMs), digital versatile disks (DVDs) or other optical disk memories, magnetic cassettes, magnetic tapes, magnetic disk memories or other magnetic memory devices, or any other mediums that can be configured to store desired information and can be accessed by computers.

The computer-readable storage medium in this embodiment can be configured to store one or more computer programs that can be executed by a processor to implement at least one of the steps in the method for measuring the total radiated power of an array antenna described in Embodiments one to three.

In the method, apparatus, system and terminal device for measuring the total radiation power of an array antenna and the computer storage medium according to the embodiments of the present disclosure, an array antenna to be measured is partitioned so that the number of sampling points is reduced during the process of measuring the total radiation power of the array antenna. In some implementations, the testing efficiency can be greatly improved.

The forgoing description merely shows the further detailed description of the embodiments of the present disclosure with reference to the specific implementations, and the specific implementations of the present disclosure shall not be deemed as being limited thereto. A person having ordinary skill in the art can make several simple derivations or replacements without departing from the concept of the present disclosure, and the derivations or replacements shall fall into the protection scope of the present disclosure.

The invention claimed is:

1. A method for measuring the total radiated power of an array antenna, comprising:
dividing an array antenna to be measured into N antenna sub-arrays, the N being greater than or equal to 2;
determining a sampling interval according to the sizes of the N antenna sub-arrays;
determining sampling points according to the sampling interval; and
determining the total radiated power of the entire array antenna according to the equivalent isotropic radiated power of the sampling points.

2. The method for measuring the total radiated power of an array antenna of claim 1, wherein the determining a sampling interval according to the sizes of the N antenna sub-arrays comprises:
determining a Rayleigh resolution according to the maximum sizes of the N antenna sub-arrays; and
determining the sampling interval according to the Rayleigh resolution.

3. The method for measuring the total radiated power of an array antenna of claim 2, wherein the sampling interval is equal to the Rayleigh resolution.

4. The method for measuring the total radiation power of an array antenna of claim 2, wherein the determining sampling points according to the sampling interval comprises:
uniformly sampling in an angular space at the sampling interval to determine sampling points.

5. The method for measuring the total radiation power of an array antenna of claim 2, wherein the determining sampling points according to the sampling interval comprises:
uniformly sampling in a normalized wave vector space at the sampling interval to determine sampling points.

6. The method for measuring the total radiation power of an array antenna of claim 1, wherein the determining the total radiated power of the entire array antenna according to the radiated power of the sampling points comprises:
according to the N divided antenna sub-arrays, allowing each antenna sub-array to transmit power independently;
measuring the equivalent isotropic radiated power of the sampling points in each antenna sub-array;
determining the total radiated power of each antenna sub-array according to the equivalent isotropic radiated power; and
determining the total radiated power of the entire array antenna according to the total radiated power of each antenna sub-array.

7. The method for measuring the total radiation power of an array antenna of claim 1, wherein the determining the total radiated power of the entire array antenna according to the radiated power of the sampling points comprises:
dividing the array antenna to be measured into $N=2^n$ antenna sub-arrays by dichotomy;
inverting the $N=2^n$ antenna sub-arrays divided by dichotomy for $N=2^n$ times;

measuring the total radiated power of an inverted sequence according to the sampling points after each inversion; and determining the total radiated power of the entire array antenna according to the total radiated power corresponding to each inverted sequence.

8. A system for measuring the total radiated power of an array antenna, comprising an equipment under test (EUT) fixed on a turntable, a testing antenna system, a power detector and a tester, wherein, the EUT comprises an array antenna and a radio remote unit which are integrated together, the power detector is connected to the testing antenna system, and the tester is connected to the EUT, the turntable, the testing antenna system and the power detector, respectively, to perform a method for measuring the total radiated power of an array antenna comprising:

dividing the array antenna to be measured into N antenna sub-arrays, the N being greater than or equal to 2;

determining a sampling interval according to the sizes of the N antenna sub-arrays;

determining sampling points according to the sampling interval; and determining the total radiated power of the entire array antenna according to the equivalent isotropic radiated power of the sampling points.

9. The system of claim 8, wherein the determining a sampling interval according to the sizes of the N antenna sub-arrays comprises:

determining a Rayleigh resolution according to the maximum sizes of the N antenna sub-arrays; and determining the sampling interval according to the Rayleigh resolution.

10. The system of claim 9, wherein the sampling interval is equal to the Rayleigh resolution.

11. The system of claim 9, wherein the determining sampling points according to the sampling interval comprises:

uniformly sampling in an angular space at the sampling interval to determine sampling points.

12. A terminal device for measuring the total radiated power of an array antenna, comprising a processor, a memory and a communication bus, wherein, the communication bus is configured to provide communication between the processor and the memory;

the memory is configured to store computer programs; and the processor is configured to execute one or more computer programs stored in the memory to perform a method for measuring the total radiated power of an array antenna comprising:

dividing an array antenna to be measured into N antenna sub-arrays, the N being greater than or equal to 2;

determining a sampling interval according to the sizes of the N antenna sub-arrays;

determining sampling points according to the sampling interval; and determining the total radiated power of the entire array antenna according to the equivalent isotropic radiated power of the sampling points.

13. The terminal device of claim 12, wherein the determining a sampling interval according to the sizes of the N antenna sub-arrays comprises:

determining a Rayleigh resolution according to the maximum sizes of the N antenna sub-arrays; and determining the sampling interval according to the Rayleigh resolution.

14. The terminal device of claim 13, wherein the sampling interval is equal to the Rayleigh resolution.

15. The terminal device of claim 13, wherein the determining sampling points according to the sampling interval comprises:

uniformly sampling in an angular space at the sampling interval to determine sampling points.

16. A non-transitory computer-readable storage medium, storing one or more computer programs which, when executed by one or more processors, cause the one or more processors to perform a method for measuring the total radiated power of an array antenna comprising:

dividing an array antenna to be measured into N antenna sub-arrays, the N being greater than or equal to 2;

determining a sampling interval according to the sizes of the N antenna sub- arrays;

determining sampling points according to the sampling interval; and determining the total radiated power of the entire array antenna according to the equivalent isotropic radiated power of the sampling points.

17. The non-transitory computer-readable storage medium of claim 16, wherein the determining a sampling interval according to the sizes of the N antenna sub-arrays comprises:

determining a Rayleigh resolution according to the maximum sizes of the N antenna sub-arrays; and determining the sampling interval according to the Rayleigh resolution.

18. The non-transitory computer-readable storage medium of claim 17, wherein the sampling interval is equal to the Rayleigh resolution.

19. The non-transitory computer-readable storage medium of claim 17, wherein the determining sampling points according to the sampling interval comprises:

uniformly sampling in an angular space at the sampling interval to determine sampling points.

20. The non-transitory computer-readable storage medium of claim 17, wherein the determining sampling points according to the sampling interval comprises:

uniformly sampling in a normalized wave vector space at the sampling interval to determine sampling points.

* * * * *

UNITED STATES PATENT AND TRADEMARK OFFICE
CERTIFICATE OF CORRECTION

PATENT NO. : 11,879,926 B2
APPLICATION NO. : 17/618748
DATED : January 23, 2024
INVENTOR(S) : Hua Gao et al.

Page 1 of 1

It is certified that error appears in the above-identified patent and that said Letters Patent is hereby corrected as shown below:

On the Title Page

The Left Column, Item (71), under "Applicant" reads:
"ZTE CORPORATION, Shenzhen (CN)"

Should read:
"XI'AN ZHONGXING NEW SOFTWARE CO., LTD., Xi'an (CN)"

Signed and Sealed this
Second Day of April, 2024

Katherine Kelly Vidal
*Director of the United States Patent and Trademark Office*